(12) United States Patent
Nomura et al.

(10) Patent No.: US 7,541,098 B2
(45) Date of Patent: Jun. 2, 2009

(54) LIGHT-EMITTING ORGANIC COMPOUND AND LIGHT-EMITTING ELEMENT UTILIZING THE SAME

(75) Inventors: Ryoji Nomura, Kanagawa (JP); Atsushi Tokuda, Kanagawa (JP); Hiroko Abe, Tokyo (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 556 days.

(21) Appl. No.: 10/898,625

(22) Filed: Jul. 26, 2004

(65) Prior Publication Data

US 2005/0095455 A1 May 5, 2005

(30) Foreign Application Priority Data

Jul. 28, 2003 (JP) ............... 2003-280687

(51) Int. Cl.
*H01J 1/62* (2006.01)
*C09K 11/06* (2006.01)

(52) U.S. Cl. ............... 428/690; 428/917; 313/504; 556/431; 556/465

(58) Field of Classification Search ........... 428/690, 428/917; 313/504, 506; 556/489, 430, 431, 556/465; 252/301.16, 103; 257/40, 103
See application file for complete search history.

(56) References Cited

U.S. PATENT DOCUMENTS

| | | | | |
|---|---|---|---|---|
| 6,232,001 | B1 | 5/2001 | Igarashi | 428/690 |
| 6,310,231 | B1* | 10/2001 | Igarashi et al. | 556/489 |
| 6,323,355 | B2 | 11/2001 | Igarashi | 556/431 |
| 6,338,909 | B1 | 1/2002 | Kwon et al. | 428/690 |
| 6,558,819 | B1* | 5/2003 | Igarashi | 428/690 |
| 6,808,826 | B2* | 10/2004 | Kim et al. | 428/690 |
| 7,183,010 | B2* | 2/2007 | Jarikov | 428/690 |
| 2001/0014752 | A1 | 8/2001 | Igarashi | 556/465 |

FOREIGN PATENT DOCUMENTS

| | | |
|---|---|---|
| JP | 2000-021575 | 1/2000 |
| JP | 2000-143558 | 5/2000 |
| JP | 2000-239291 | 9/2000 |
| JP | 2000-351966 | 12/2000 |

OTHER PUBLICATIONS

International Search Report (Application No. PCT/JP2004/010104), Oct. 19, 2004 (in Japanese), 5 pages.
Written Opinion (Application No. PCT/JP2004/010104), Oct 19, 2004 (partial translation), 10 pages.

* cited by examiner

*Primary Examiner*—D. Lawrence Tarazano
*Assistant Examiner*—Camie S Thompson
(74) *Attorney, Agent, or Firm*—Fish & Richardson P.C.

(57) ABSTRACT

A light-emitting organic compound that is superior in electrochemical stability, chemical stability, and thermal stability is provided. The compound also, shows blue luminescence with favorable color purity, and is represented by the following general formula (1). In the formula, $X^1$ represents a silyl group in which one or more aryl groups having 5 to 10 carbon atoms are bound to silicon or an alkyl group having 1 to 4 carbon atoms. $Ar^1$ represents an unsubstituted or substituted aryl group having 5 to 15 carbon atoms. $Ar^2$ represents an aryl group having 5 to 20 carbon atoms, and may have a substituent at a site different from a binding site to $Ar^1$.

$$X^1-Ar^1-Ar^2 \tag{1}$$

62 Claims, 7 Drawing Sheets

LIGHT-EMITTING ORGANIC COMPOUND AND LIGHT-EMITTING ELEMENT UTILIZING THE SAME

TECHNICAL FIELD

The present invention relates to a light-emitting organic compound and a light-emitting element using the light-emitting organic compound.

BACKGROUND ART

A display for displaying images is one of light-emitting devices necessary in modern life, which takes various configurations, such as so-called TV monitors, liquid crystal displays that have been developed rapidly in recent years, and organic EL displays that are expected to develop future, to meet requirements. Above all, an organic EL (Electro Luminescence) display has been most attracting attention as a next-generation flat panel display device.

In the light-emission mechanism of a light-emitting element composing an organic EL display, by locating a light-emitting layer comprising a light emitter composition of between electrodes and applying a current, an electron injected from a cathode and a hole injected from an anode are recombined in a luminescent center of the light-emitting layer to form a molecular exciton, and a photon emitted when the molecular exciton returns to the ground state is used. In principle, the energy difference between the excited state and the ground state (hereinafter, referred to as a band gap) corresponds to a maximum wavelength of luminescence. Therefore, the band gap most contributes to an luminescence color.

In order to utilize a light-emitting element as a full-color display for displaying images, regions capable of emitting at least light's three primary colors of red, blue, and green (hereinafter, referred to as "pixels") may be provided independently, and the individual pixels may be made to emit light at the right and appropriate time. In this case, the luminescence colors of light emitter compositions to be used for the individual pixels come down to affect the quality of the display most greatly. Therefore, a luminescent material capable of emitting light of a red, blue, or green color with favorable color purity is required. The favorable color purity mentioned here is evaluated by x and y coordinate values in CIE chromaticity coordinates. As the blue color, positive x and y values near 0 are ideal. As the green, x about 0.5 and a y value about 0.8 are ideal. At the same time, as the red, x about 0.7 and y about 0.25 are ideal. These ideal values are not always needed, or are not actually achieved. However, these values are ideal in order to recreate more natural colors.

Further, the individual light emitters are required to have various performances, specifically such as electrochemical stability, chemical stability, thermal stability, a low degree of crystallinity, and a high carrier transporting property. Unless these requirements are met, it is not possible to manufacture a light-emitting element with a long life even if luminescence with favorable color purity can be obtained.

DISCLOSURE OF THE INVETION (Problems to be Solved by the Invention)

It is an object of the present invention to provide a light-emitting organic compound that is superior in electrochemical stability, chemical stability, and thermal stability. In addition, it is also an object to provide a material that shows blue luminescence with favorable color purity. Further, it is also an object to provide a light-emitting element that has a life extended by using the light-emitting organic compound according to the present invention.

(Means for Solving the Problems)

A light-emitting organic compound according to the present invention is characterized by having an aryl group having 5 to 20 carbon atoms as a moiety, which has a silyl group as a substituent in which one or more aryl groups having 5 to 10 carbon atoms are bound to silicon.

As the above-mentioned aryl groups having 5 to 10 carbon atoms, light-emitting groups such as a phenyl group, a naphthyl group, and an anthryl group, and a phenanthryl group can be cited. In addition, groups such as a pyridyl group and thienyl group including a nitrogen atom or a sulfur atom as a hetero atom may be used.

To more specify the above-mentioned silyl group having one or more aryl groups having 5 to 10 carbon atoms, a group such as a triarylsilyl group or a diarylsilyl group can be cited.

As the aryl group having 5 to 20 carbon atoms, light-emitting substituents such as an anthryl group, a phenanthryl group, a pyrenyl group, a perillyl group, and a quinoxalyl group can be cited. In addition, a group such as a phenanthrolyl group including a nitrogen atom as a hetero atom may be used.

The light-emitting organic compound indicates an organic compound having a light-emitting substituent such as the above-mentioned the aryl group having 5 to 20 carbon atoms as a moiety.

Light-emitting organic compounds according to the present invention will be described more specifically below.

The present invention provides a light-emitting organic compound represented by the following general formula (1).

$$X^1—Ar^1—Ar^2 \quad (1)$$

(In the formula, $X^1$ represents a silyl group in which one or more aryl groups having 5 to 10 carbon atoms are bound to silicon or an alkyl group having 1 to 4 carbon atoms. $Ar^1$ represents an unsubstituted or substituted aryl group having 5 to 15 carbon atoms. $Ar^2$ represents an aryl group having 5 to 20 carbon atoms, and may have a substituent at a site different from a binding site to $Ar^1$.)

The present invention provides a light-emitting organic compound represented by the following general formula (2).

$$X^1—Ar^1—Ar^2—Ar^3—X^2 \quad (2)$$

(In the formula, $X^1$ and $X^2$, which may be identical or different, individually represent a silyl group in which one or more aryl groups having 5 to 10 carbon atoms are bound to silicon or an alkyl group having 1 to 4 carbon atoms. $Ar^1$ and $Ar^3$, which may be identical or different, individually represent an unsubstituted or substituted aryl group having 5 to 15 carbon atoms. $Ar^2$ represents an aryl group having 5 to 20 carbon atoms, and may have a substituent at a site different from binding sites to $Ar^1$ and $Ar^3$.)

The present invention provides a light-emitting organic compound represented by the following general formula (3).

(3)

(In the formula, $Ar^1$ represents an unsubstituted or substituted aryl group having 5 to 15 carbon atoms. $Ar^2$ represents an aryl group having 5 to 20 carbon atoms, and may have a substituent at a site different from a binding site to Ar¹. R¹ to R³, which may be identical or different, are individually represented by any of a hydrogen atom, an alkyl group having 1 to 6 carbon atoms, and an unsubstituted or substituted aryl group having 5 to 15 carbon atoms while at least one of R¹ to R³ is represented by an unsubstituted or substituted aryl group having 5 to 15 carbon atoms.)

The present invention provides a light-emitting organic compound represented by the following general formula (4).

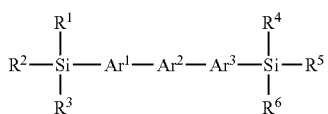

(4)

(In the formula, Ar¹ and Ar³, which may be identical or different, individually represent an unsubstituted or substituted aryl group having 5 to 15 carbon atoms. Ar² represents an aryl group having 5 to 20 carbon atoms, and may have a substituent at a site different from binding sites to Ar¹ and Ar³. R¹ to R⁶, which may be identical or different, are individually represented by any of a hydrogen atom, an alkyl group having 1 to 6 carbon atoms, and an unsubstituted or substituted aryl group having 5 to 15 carbon atoms while at least one of R¹ to R³ and at least one of R⁴ to R⁶ are represented by an unsubstituted or substituted aryl group having 5 to 15 carbon atoms.)

The present invention provides a light-emitting organic compound represented by the following general formula (5).

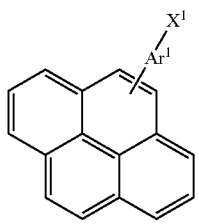

(5)

(In the formula, X¹ represents a silyl group in which one or more aryl groups having 5 to 10 carbon atoms are bound to silicon or an alkyl group having 1 to 4 carbon atoms. Ar¹ represents an unsubstituted or substituted aryl group having 5 to 15 carbon atoms.)

The present invention provides a light-emitting organic compound represented by the following general formula (6).

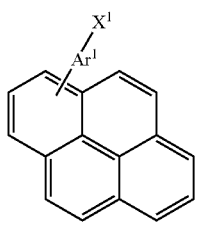

(6)

(In the formula, X¹ represents a silyl group in which one or more aryl groups having 5 to 10 carbon atoms are bound to silicon or an alkyl group having 1 to 4 carbon atoms. Ar¹ represents an unsubstituted or substituted aryl group having 5 to 15 carbon atoms.)

The present invention provides a light-emitting organic compound represented by the following general formula (7).

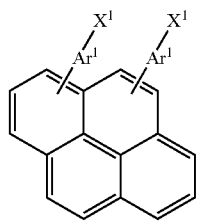

(7)

(In the formula, X¹ and X², which may be identical or different, individually represent a silyl group in which one or more aryl groups having 5 to 10 carbon atoms are bound to silicon or an alkyl group having 1 to 4 carbon atoms. Ar¹ and Ar³, which may be identical or different, individually represent an unsubstituted or substituted aryl group having 5 to 15 carbon atoms.)

The present invention provides a light-emitting organic compound represented by the following general formula (8).

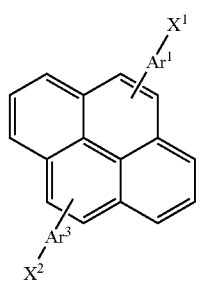

(8)

(In the formula, X¹ and X², which may be identical or different, individually represent a silyl group in which one or more aryl groups having 5 to 10 carbon atoms are bound to silicon or an alkyl group having 1 to 4 carbon atoms. Ar¹ and Ar³, which may be identical or different, individually represent an unsubstituted or substituted aryl group having 5 to 15 carbon atoms.)

The present invention provides a light-emitting organic compound represented by the following general formula (9).

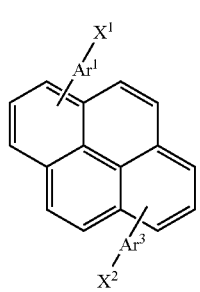

(9)

(In the formula, X¹ and X², which may be identical or different, individually represent a silyl group having one or more aryl groups having 5 to 10 carbon atoms or an alkyl group having 1 to 4 carbon atoms. $Ar^1$ and $Ar^3$, which may be identical or different, individually represent an unsubstituted or substituted aryl group having 5 to 15 carbon atoms.)

The present invention provides a light-emitting organic compound represented by the following general formula (10).

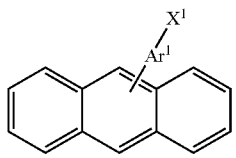
(10)

(In the formula, $X^1$ represents a silyl group in which one or more aryl groups having 5 to 10 carbon atoms are bound to silicon or an alkyl group having 1 to 4 carbon atoms. $Ar^1$ represents an unsubstituted or substituted aryl group having 5 to 15 carbon atoms.)

The present invention provides a light-emitting organic compound represented by the following general formula (11).

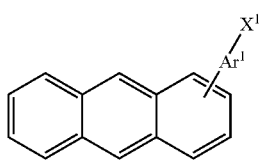
(11)

(In the formula, $X^1$ represents a silyl group in which one or more aryl groups having 5 to 10 carbon atoms are bound to silicon or an alkyl group having 1 to 4 carbon atoms. $Ar^1$ represents an unsubstituted or substituted aryl group having 5 to 15 carbon atoms.)

The present invention provides a light-emitting organic compound represented by the following general formula (12).

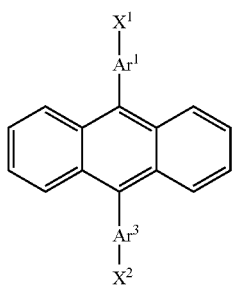
(12)

(In the formula, $X^1$ and $X^2$, which may be identical or different, individually represent a silyl group in which one or more aryl groups having 5 to 10 carbon atoms are bound to silicon or an alkyl group having 1 to 4 carbon atoms. $Ar^1$ and $Ar^3$, which may be identical or different, individually represent an unsubstituted or substituted aryl group having 5 to 15 carbon atoms.)

The present invention provides a light-emitting organic compound represented by the following general formula (13).

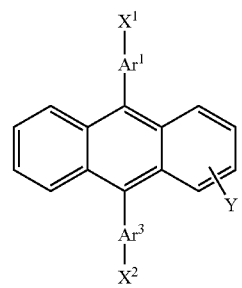
(13)

(In the formula, $X^1$ and $X^2$, which may be identical or different, individually represent a silyl group in which one or more aryl groups having 5 to 10 carbon atoms are bound to silicon or an alkyl group having 1 to 4 carbon atoms. $Ar^1$ and $Ar^3$, which may be identical or different, individually represent an unsubstituted or substituted aryl group having 5 to 15 carbon atoms. Y represents an alkyl group having 1 to 6 carbon atoms or an aryl group having 6 to 14 carbon atoms.)

Here are specific examples (14) to (18) of the light-emitting organic compounds according to the present invention.

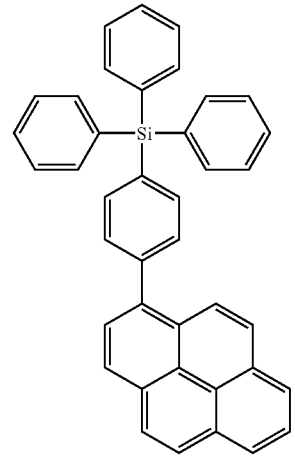
(14)

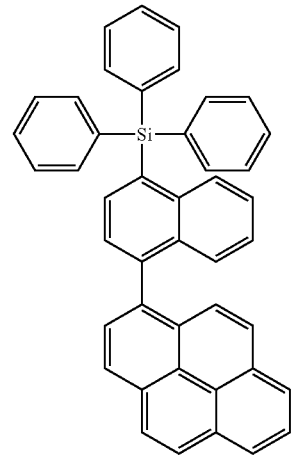
(15)

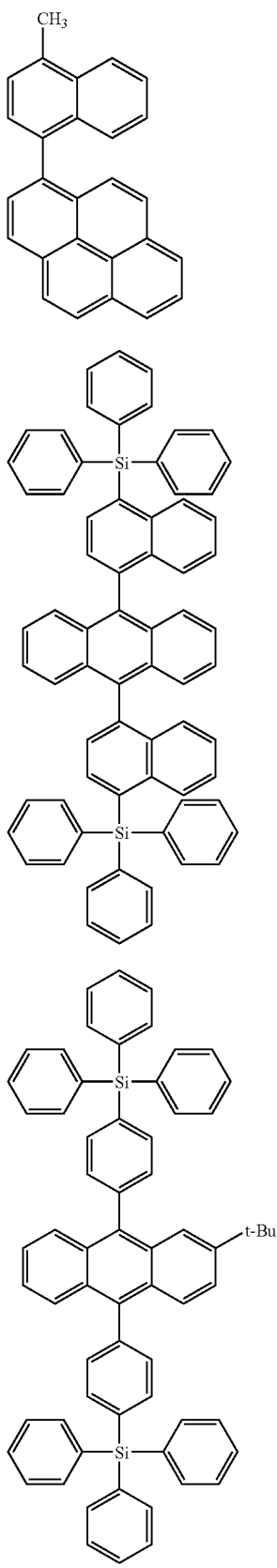

The above-described light-emitting organic compounds according to the present invention, which have, as a moiety, a silyl group having one or more aryl groups having 5 to 10 carbon atoms or an aryl group having an alkyl group having 1 to 4 carbon atoms as a substituent, are unlikely to crystallize at deposition, and show a favorable film forming property as a materials to be used for a light-emitting element. Since the silyl group is a substituent with high thermal stability, the light-emitting organic compounds that have the substituent as a moiety also have a feature of high thermal stability. In addition, when the alkyl group is particularly a lower alkyl group having 1 to 4 carbon atoms, the thermal stability becomes relatively favorable.

In the light-emitting organic compounds represented by the above (1) to (13), it is preferable that $Ar^2$ is an aryl group having 5 to 20 carbon atoms, more preferably, an aryl group having 8 to 16 carbon atoms. As specific examples of the substituent like that, groups such as an anthryl group, a phenanthryl group, a pyrenyl group, a perillyl group, and a quinoxalyl group can be cited. In addition, a group such as a phenanthrolyl group including a nitrogen atom as a hetero atom may be used.

In the light-emitting organic compounds represented by the above general formulas (1) to (4), it is preferable that $Ar^2$ is an aryl group having more carbon atoms than $Ar^1$ or $Ar^3$. This makes it easier to synthesize light-emitting organic compounds according to the present invention.

In particular, in the case of having a silyl group, deposition by vacuum deposition becomes easier since the silyl group is a substituent with low polarity and increase in vapor pressure of the compound can be ignored. In addition, particularly in a silyl group to which a substituent with sterically hindrance is introduced, a carbon-silicon bond is chemically stable and resistant to strong acids, for example, trifluoromethanesulfonic acid and trifluoroacetic acid. Even after being electrochemically oxidized, it is possible to return to the former state by an electrochemical reduction reaction, so that the light-emitting organic compounds are superior in electrical stability.

Another structure according to the present invention is a light-emitting element that has the light-emitting organic compound according to the present invention.

As the light-emitting element, one that has a structure having a layer including the light-emitting organic compound between a pair of electrodes can be cited as a typical example. However, a light-emitting element that has a structure other than this may also be employed.

Since the above light-emitting organic compounds according to the present invention has thermal stability, chemical stability, and an electrochemical stability, the life of a light-emitting element can be extended by using the light-emitting organic compound according to the present invention.

The light-emitting organic compounds according to the present invention, which have a light-emitting property and a carrier transporting property, can be used as a guest material (light-emitter) in combination with a host material, and can be used as a host material in combination with a guest material since the light-emitting organic compounds are unlikely to crystallize and have a favorable film forming property. Alternatively, the light-emitting organic compounds can be used by themselves for a light-emitting element without particularly containing a guest material.

(Effect of the Invention)

According to the present invention, a light-emitting organic compound that has thermal stability, chemical stability, and electrochemical stability can be obtained. Further, a light-emitting organic compound that emits blue light with favorable color purity can also be obtained. In addition, the life of a light-emitting element can be extended by using the luminescent material according to the present invention.

BRIEF DESCRIPTION OF DRAWINGS

FIG. 1 is a diagram for describing a light-emitting element using a luminescent material according to the present invention.

FIG. 2 is a diagram showing luminance-voltage characteristics of a light-emitting element according to the present invention.

FIG. 3 is a diagram showing an emission spectrum characteristic of a luminescent material according to the present invention.

FIG. 4 is a diagram showing luminance-voltage characteristics of a light-emitting element according to the present invention.

FIG. 5 is a diagram showing an emission spectrum characteristic of a luminescent material according to the present invention.

FIG. 6 is a diagram for describing a light-emitting device of a luminescent material according to the present invention.

FIG. 7 is a diagram for describing electronic devices to which the present invention is applied.

EXPLANATION OF REFERENCE 11 substrate, 12 anode, 13 hole injecting material, 14 hole transporting material, 15 light-emitting layer, 16 electron transporting layer, 17 cathode,
401 source side driver circuit, 402 pixel portion, 403 gate side driver circuit, 404 sealing substrate, 405 sealing material, 407 space, 408 wiring, 409 FPC, 410 substrate, 411 switching TFT, 412 current controlling TFT, 413 electrode,
414 insulator, 416 layer including luminescent material, 417 electrode, 418 light-emitting element, 423 n-channel TFT, 424 p-channel TFT
5501 frame body, 5502 support, 5503 display portion, 5511 main body, 5512 display portion, 5513 voice input, 5514 operation switches, 5515 battery, 5516 an image receiving portion, 5521 main body, 5522 frame body, 5523 display portion, 5524 keyboard,
5531 main body, 5532 stylus, 5533 display portion, 5534 operation buttons, 5535 external interface, 5551 main body, 5552 display portion (A),
5553 eye piece, 5554 operation switches, 5555 display portion (B), 5556 battery, 5561 main body, 5562 voice output portion, 5563 microphone, 5564 display portion,
5565 operation switches, 5566 antenna

BEST MODE FOR CARRYING OUT THE INVENTION

Figure 1:
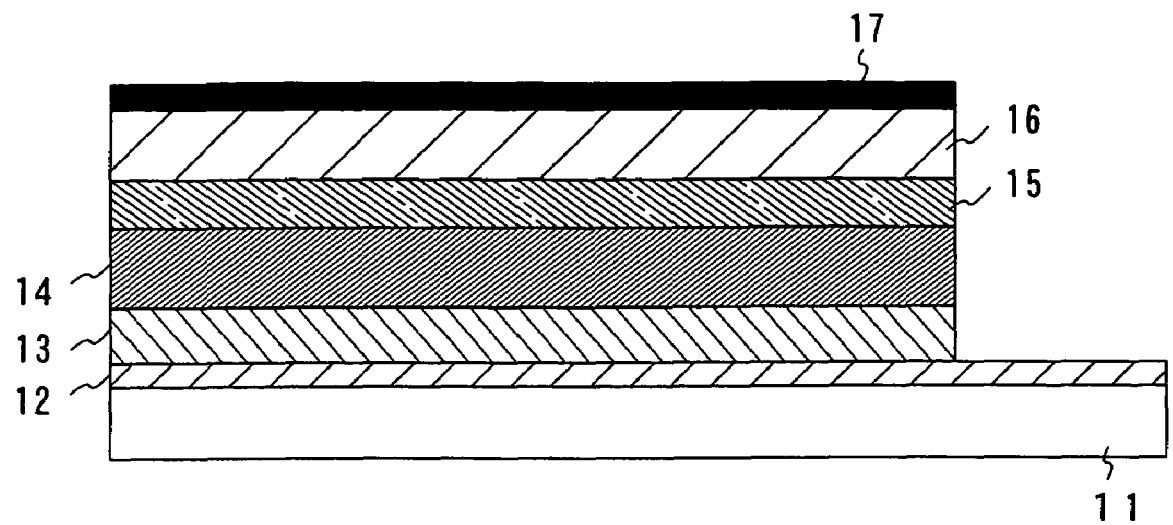
[FIG. 1]

In the present embodiment, a fundamental structure of a light-emitting element using a light-emitting organic compound represented by any of the above general formulas or structure formulas (1) to (18) with reference to FIG. 1. The structure of the element shown in the implement of the present invention is a structure in which a hole injecting layer, a hole transporting layer, a light-emitting layer, and an electron transporting layer are provided between a cathode and an anode. However, the present invention is not limited to this, and various light-emitting element structures, for example, structures such as an anode/a hole injecting layer/a light-emitting layer/an electron transporting layer/a cathode, an anode/a hole injecting layer/a hole transporting layer/a light-emitting layer/an electron transporting layer/an electron injecting layer/a cathode, an anode/a hole injecting layer/a hole transporting layer/a light-emitting layer/a hole blocking layer/an electron transporting layer/a cathode, and an anode/a hole injecting layer/a hole transporting layer/a light-emitting layer/a hole blocking layer/an electron transporting layer/an electron injecting layer/a cathode, may be employed. In these light-emitting elements, the compound can be used for the hole injecting layer, the hole transporting layer, or the light-emitting layer.

In FIG. 1, reference numeral 11 denotes a substrate supporting a light-emitting element, which can comprise glass, quarts, transparent plastics, or the like. Reference numeral 12 denotes an anode, for which it is preferable to use a metal, an alloy, an electrically conductive compound, a mixture thereof, and the like, which have a large work function (a work function of 4.0 eV or more). As a specific example of the anode material, it is possible to use gold (Au), platinum (Pt), nickel (Ni), tungsten (W), chromium (Cr), molybdenum (Mo), iron (Fe), cobalt (Co), copper (Cu), palladium (Pd) or a nitride of a metal material (TiN), in addition to ITO or IZO (indium zinc oxide) of indium oxide mixed with zinc oxide (ZnO) at 2 to 20%.

Reference numeral 13 denotes a hole injecting material, for which known materials can be used. Specifically, it is possible to use polymer materials such as poly (3,4-ethylenedioxythiophene) and polyaniline doped with strong acid, starburst amines such as copper phthalocyanine and 4,4',4"-tris (N,N-diphenyl-amino)-triphenylamine (hereinafter, referred to as TDATA), and the like. Reference numeral 14 denotes a hole transporting material, for which a known material can be used. As typical examples, there are aromatic amine compounds, which include, for example, 4, 4'-bis[N-(1-naphthyl)-N-phenyl-amino]-biphenyl (hereinafter, referred to as A-NPD) and starburst aromatic amine compounds such as 4,4',4"-tris (N,N-diphenyl-amino)-triphenylamine (hereinafter, referred to as TDATA) and 4,4',4"-tris[N-(3-methylphenyl)-N-phenyl-amino]-triphenylamine (hereinafter, referred to as MTDATA). Reference numeral 15 denotes a light-emitting layer, for which a light-emitting organic compound according to the present invention, represented by any of the general formulas (1) to (18), is used. Reference numeral 16 denotes an electron transporting layer, for which a known material can be used. Specifically, as typified by a tris (8-quinolinolato) aluminum complex (hereinafter, referred to as $Alq_3$), a metal complex that has a quinoline moiety or a benzoquinoline moiety and a mixed ligand complex thereof are preferred. In addition to the metal complexes, oxadiazole derivatives such as 2-(4-biphenylyl)-5-(4-tert-butylphenyl)-1,3,4-oxadiazole (hereinafter, referred to as PBD) and 1,3-bis [5-(p-tert-butylphenyl)-1,3,4-oxadiazole-2-yl]benzene (hereinafter, referred to as OXD-7), triazole derivatives such as 3-(4-tert-butylphenyl)-4-phenyl-5-(4-biphenylyl)-1,2,4-triazole (hereinafter, referred to as TAZ) and 3-(4-tert-butylphenyl)-4-(4-ethylphenyl)-5-(4-biphenylyl)-1,2,4-triazole (hereinafter, referred to as p-EtTAZ), and phenanthroline derivatives such as bathophenanthroline (hereinafter, referred to as BPhen) and bathocuproin (hereinafter, referred to as BCP) can be used.

In the element shown in FIG. 1, a cathode 17 is formed on these respective functional layers. As the cathode, it is preferable to use a metal, an alloy, an electrically conductive compound, a mixture thereof, and the like, which have a small work function. Specifically, in addition to representative elements belonging to Group 1 or 2, that is, alkali metals such as Li and Cs, alkali earth metals such as Mg, Ca, and Sr, and alloys (Mg: Ag, Al: Li) and compounds (LiF, CsF, CaF$_2$) including these, transition metals including rare-earth metals can be used to form the cathode. However, the cathode can also be formed by a lamination layer of metals (including alloys) such as Al, Ag, and ITO.

The above-mentioned anode materials and cathode materials are formed by a method such as evaporation or sputtering.

By conduction between the electrodes of the light-emitting element shown in FIG. 1, an electron injected from a cathode and a hole injected from an anode are recombined to emit light.

EXAMPLE 1

SYNTHESIS EXAMPLE 1

In the present synthesis example, a synthesis method of 1-[(4-triphenylsilyl)phenyl]pyrene represented by the structure formula (14) will be described.

A 1.6 N hexane solution of butyllithium (7.1 mL, 11.2 mmol) was dropped at −78° C. in an anhydrous THF solution (40 mL) of 4-triphenylsilyl-1-bromobenzene (4.68 g, 11.2 mmol). After the dropping, stirring was performed at −78° C. for 1 hour. The reaction mixture was added to zinc chloride (1.83 g, 13.5 mmol) under a nitrogen atmosphere, and then, stirring was performed at room temperature for 1 hour. To the reaction mixture, 1-bromopyrene (2.6 g, 9.25 mmol), and sequentially tetrakistriohenyl-phosphinepalladium (130 mg, 0.112 mmol) were added, and then, reflux was performed until 1-bromopyrene that was a raw material disappeared. After adding 1N hydrochloric acid to the reaction mixture, extraction was performed with ether, and a ether layer was washed with a saturated salt solution. An organic layer was dried with anhydrous magnesium sulfate, and the solvent was removed after filtering. By recrystallizing the residue with ethyl acetate, a compound represented by the structure formula (14) was obtained as a pale yellow crystal. According to NMR measurement of the pale yellow crystal, results of $^1$H NMR (300 MHz, CDCl$_3$) δ 7.30-8.25 (m): $^{13}$C NMR (75 MHz, CDCl$_3$) δ 142.4, 137.5, 136.5, 136.4, 134.2, 133.0, 131.5, 131.0, 130.7, 130.1, 129.7, 128.4, 128.0, 127.9, 127.6, 127.5, 127.4, 127.3, 126.0, 125.3, 125.1, 124.9, 124.8, 124.7 were obtained, so that 1-[(4-triphenylsilyl)phenyl]pyrene could be confirmed.

SYNTHESIS EXAMPLE 2

In the present synthesis example, a synthesis method of a light-emitting organic compound represented by the structure formula (16) will be described.

A 1.58 N hexane solution of butyllithium (64 mL, 101 mmol) was dropped at −78° C. in a dried THF solution (200 mL) of 4-methyl-1-bromonaphtalene (20.4 g, 92.3 mmol). After the dropping, stirring was performed at −78° C. for 1 hour. This solution was dropped in zinc chloride (13.8 g, 101 mmol) under a nitrogen atmosphere. After stirring at room temperature for 1 hour, 1-bromopyrene (20.4 g, 72.6 mmol) and tetrakistriohenyl-phosphinepalladium (1.07 g, 0.93 mmol) were added. The reaction mixture was refluxed for 4 hours. After that, the reaction mixture was put in a lot of dilute hydrochloric acid, a deposited solid was collected by filtering. The filtered object was washed with ethanol, and sequentially with hexane. The obtained solid was dissolved in thermal ethyl acetate, and an insoluble object was separated by filtering. By condensing the obtained solution, and then leaving the condensed solution at room temperature, a recrystallization operation was performed. The deposited crystal was collected by filtering and dried under reduced pressure to obtain a compound represented by the structure formula (16), 1-(4'-methyl-1-naphthyl) pyrene, with a yield of 67%. As a result of NMR measurement of the compound, spectrum data of $^1$H NMR (300 MHz, CDCl$_3$) δ 7.20-8.30 (m, 15H), 2.83 (s, 3H) was obtained.

EXAMPLE 2

In the present example, a light-emitting element using a light-emitting organic compound represented by the structure formula (14) and characteristics of the light-emitting element will be described.

On ITO deposited on a glass substrate, copper phthalocyanine that is a hole injecting material and NPB that is a hole transporting material were sequentially deposited by vacuum deposition. The film thicknesses thereof were respectively 20 nm and 40 nm. On this laminate film, a compound represented by the structure formula (14) was deposited to have a film thickness of 30 nm, and Alq that is an electron transporting material was further laminated to have a film thickness of 20 nm. CaF$_2$ that is an electron injecting material was deposited thereon, and an Al electrode was further deposited.

Figure 2:
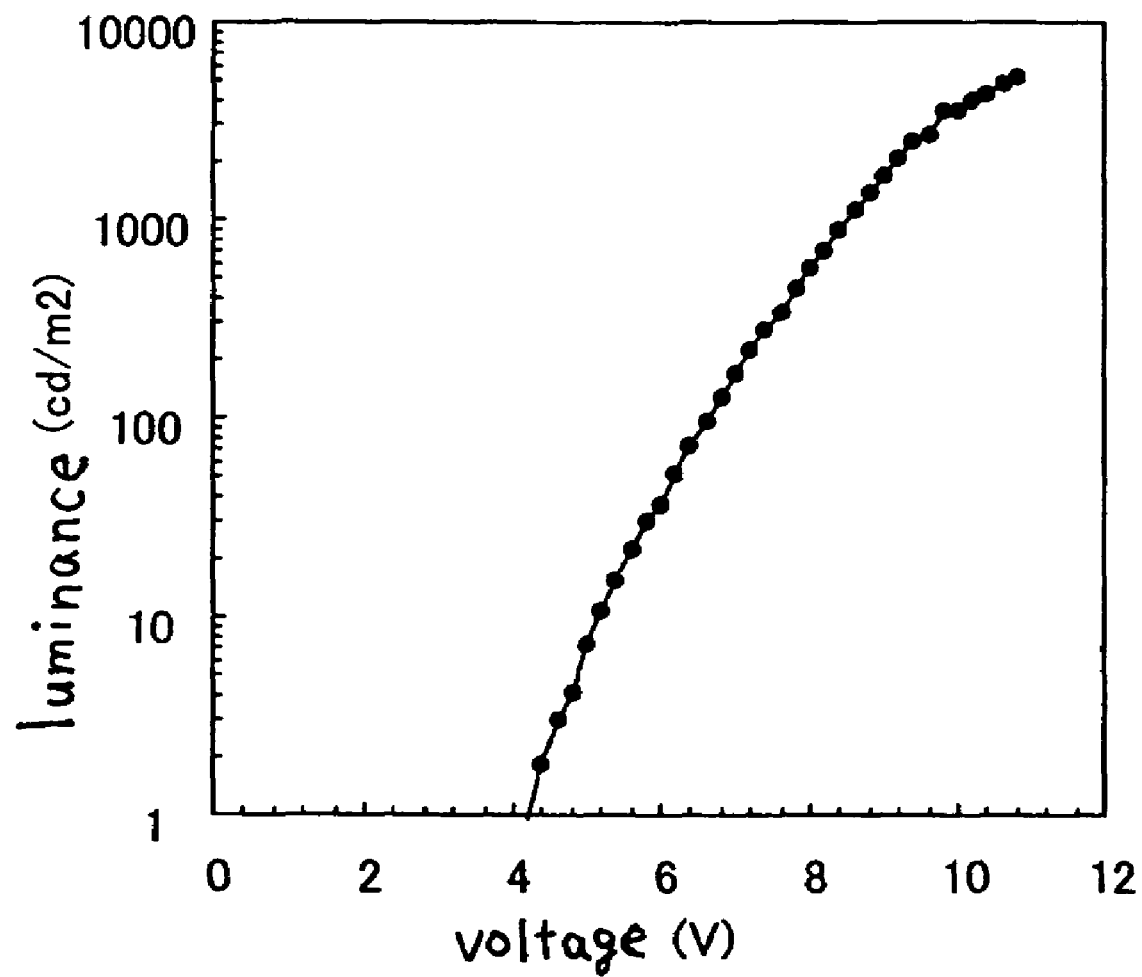
[FIG. 2]
Figure 3:
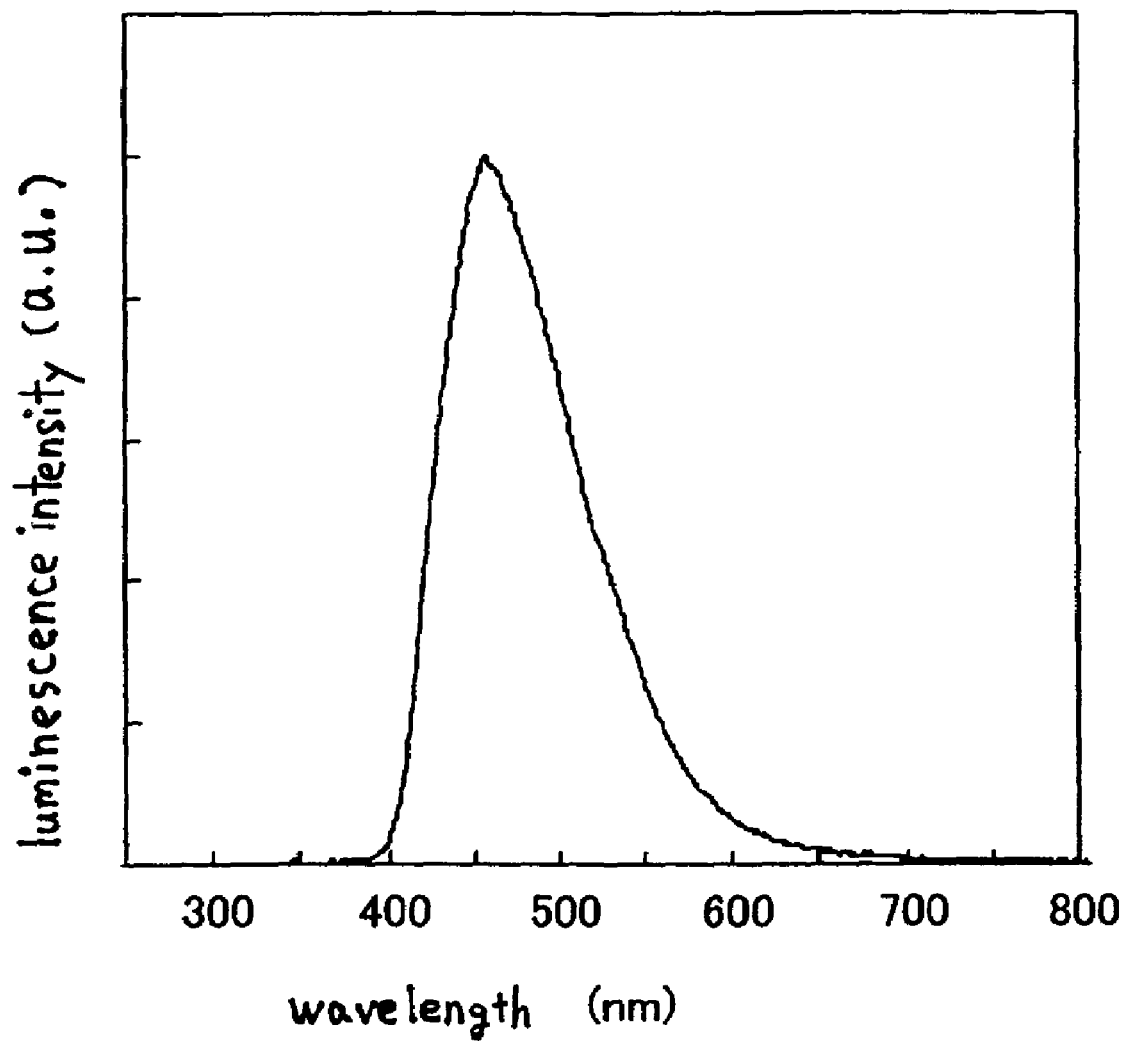
[FIG. 3]

FIG. 2 shows a voltage-luminance curve of this element. Light emission started at about 4 V, and 3600 cd/m$^2$ was obtained by applying 10 V. FIG. 3 shows an emission spectrum. There is an emission maximum at 450 nm so that emission of blue light can be confirmed. The CIE chromaticity coordinates has an x value of 0.17 and a y value of 0.23, which is found to be favorable blue luminescence.

EXAMPLE 3

In the present example, a manufacture of a light-emitting element using a compound represented by the structure formula (16) and characteristics of the element will be described.

On ITO deposited on a glass substrate, copper phthalocyanine that is a hole injecting material and NPB that is a hole transporting material were sequentially deposited by vacuum deposition. The film thicknesses thereof were respectively 20 nm and 30 nm. On this laminate film, a compound represented by the structure formula (16) was deposited to have a film thickness of 30 nm, and Alq that is an electron transporting material was further laminated to have a film thickness of 20 nm. CaF$_2$ that is an electron injecting material was deposited thereon, and an Al electrode was further deposited.

Figure 4:
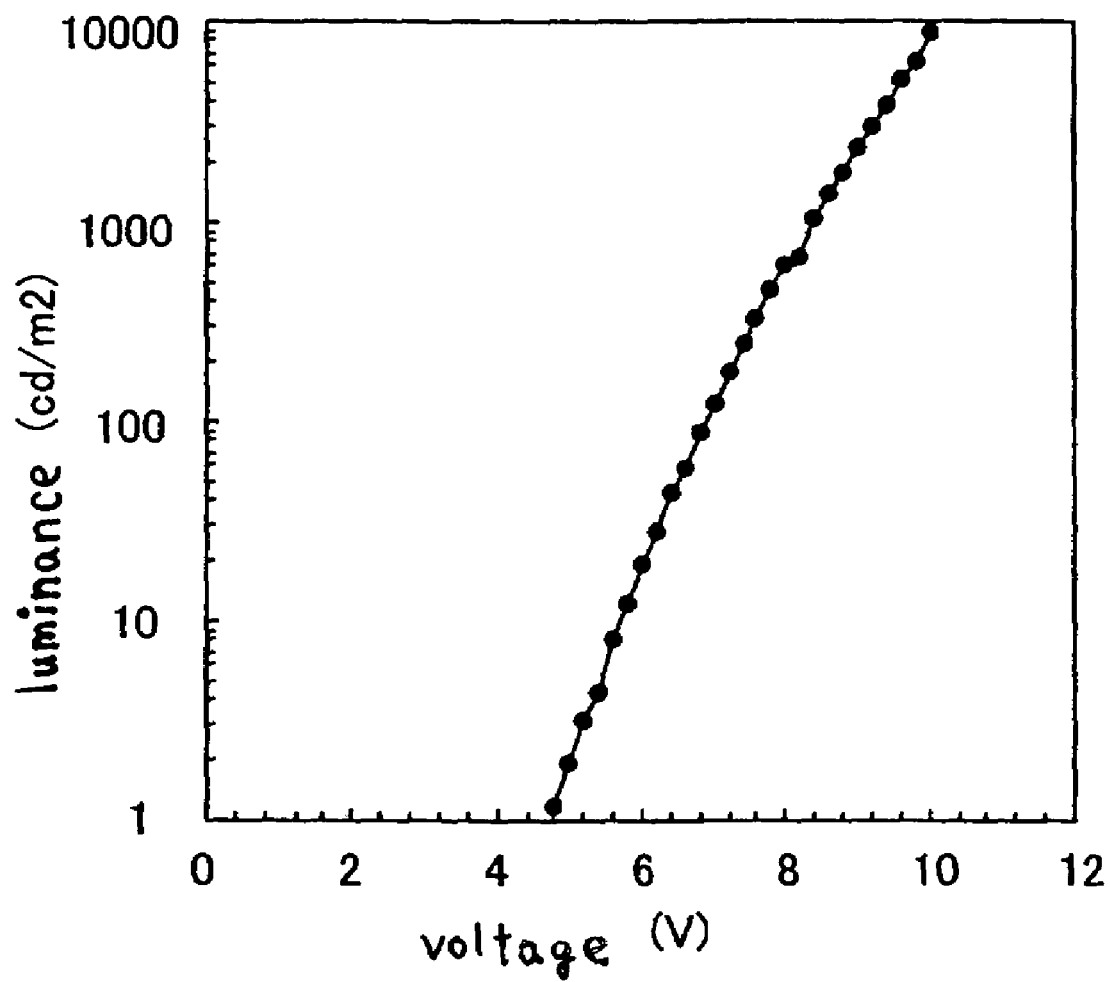
[FIG. 4]
Figure 5:
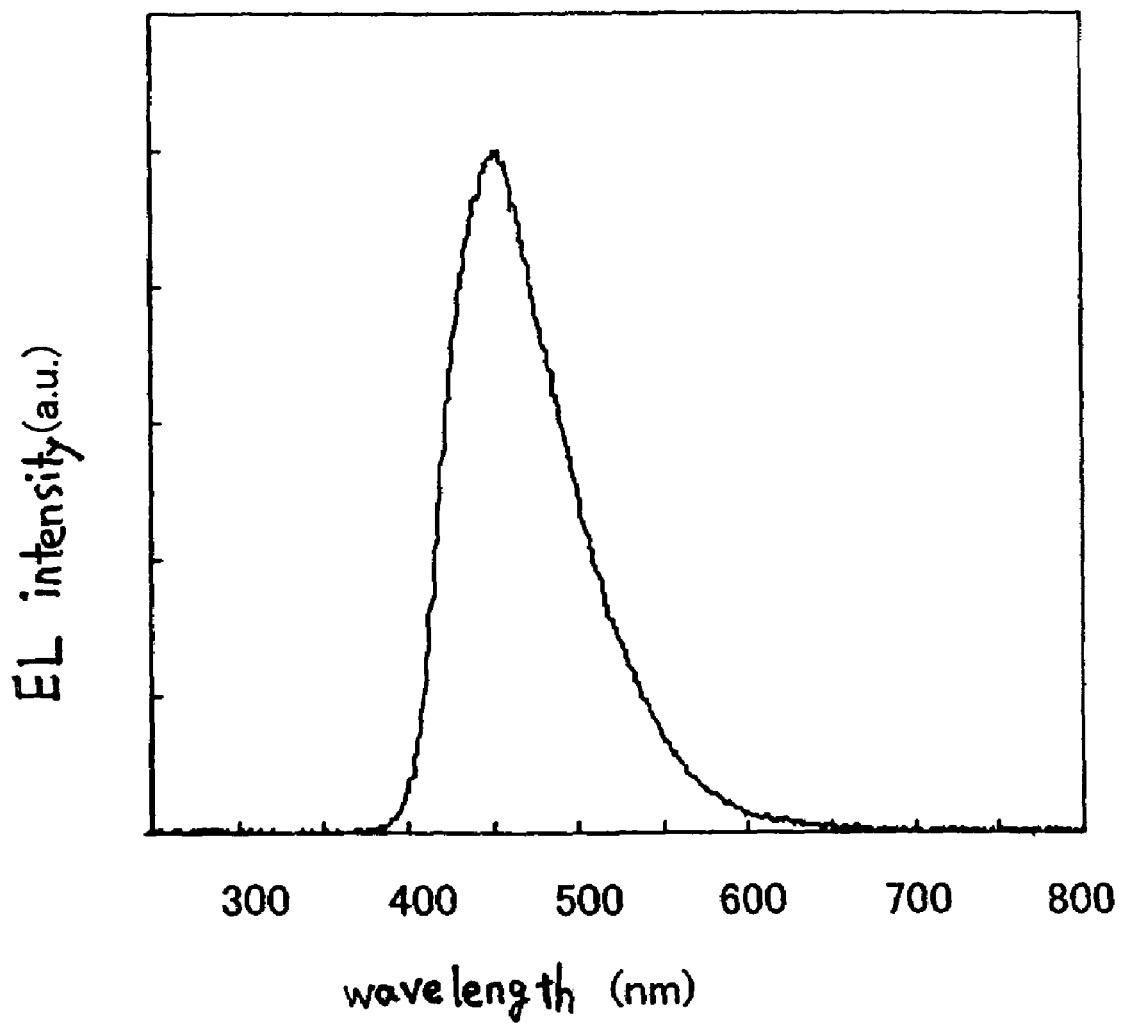
[FIG. 5]

FIG. 4 shows a voltage-luminance curve of this element. Light emission started at about 5 V, and luminescence of 9000 cd/m$^2$ was obtained by applying 10 V. FIG. 5 shows an emission spectrum. The luminescent color is blue, and there is an emission maximum at 450 nm, so that emission of blue light can be confirmed. The CIE chromaticity coordinates has an x value and a y value that are both about 0.15, which is found to be favorable blue luminescence.

EXAMPLE 4

Figure 6:
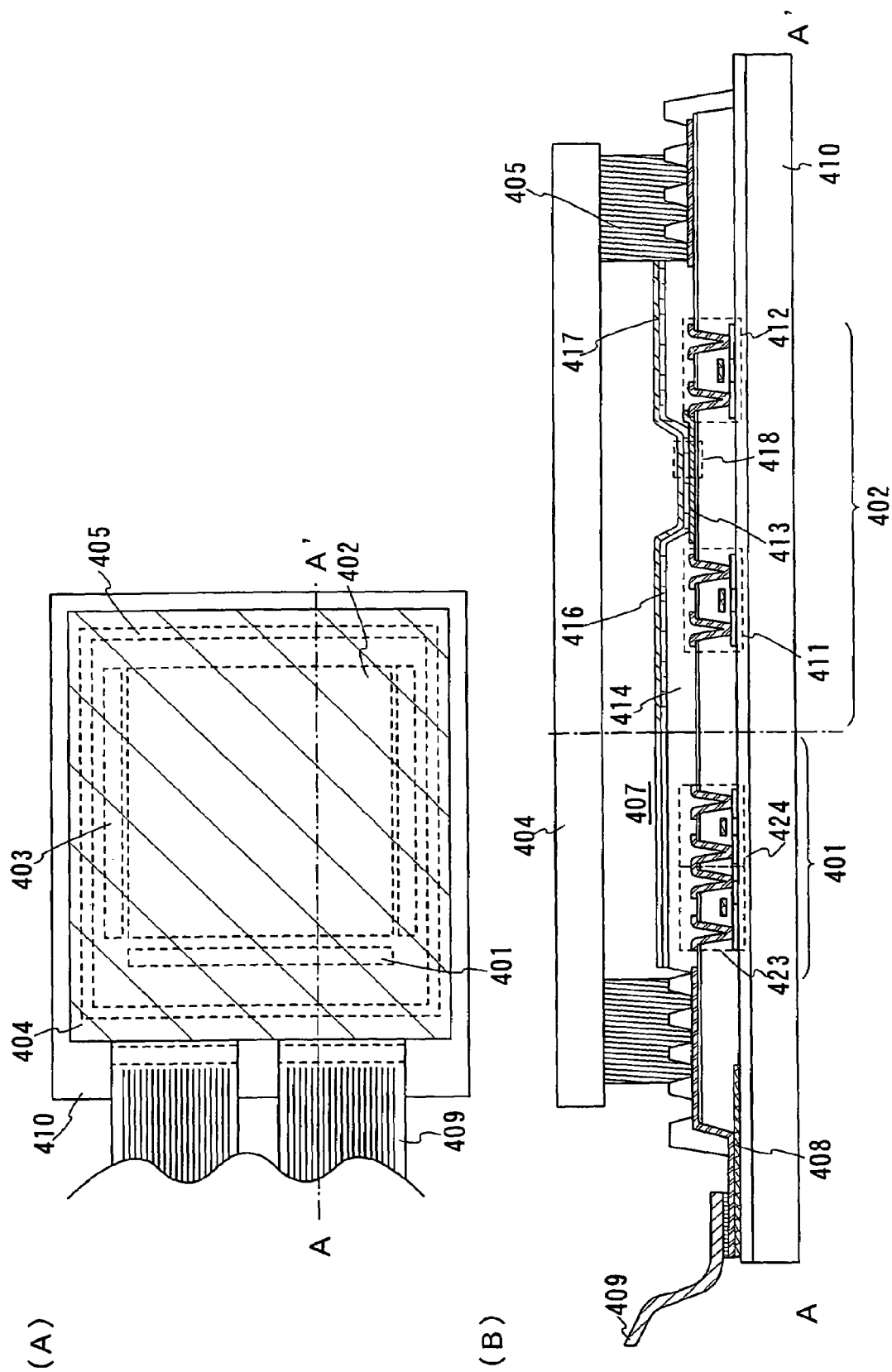
[FIG. 6]

In the present example, a light-emitting device that has a light-emitting element according to the present invention in a pixel portion will be described with reference to FIG. 6. FIG. 6(A) is a top view showing the light-emitting device and FIG. 6(B) is a cross-sectional view taken along line A-A' in FIG. 6(A). Reference numeral 401 indicated by a dotted line denotes a driver circuit portion (a source side driver circuit), reference numeral 402 denotes a pixel portion, and reference numeral 403 denotes a driver circuit portion (a gate side driver circuit). In addition, reference numerals 404 and 405 denote a sealing substrate and a sealing material, respectively. The inside surrounded by the sealing material 405 is a space 407.

A wiring 408 for transmitting signals to be input to the source side driver circuit 401 and the gate side driver circuit 403, and receives signals such as a video signal, a clock signal, a start signal, and a reset signal from FPC (Flexible Printed Circuit) 409 that serves as an external input terminal. Though only the FPC is shown in the figure here, a printed wiring board (PWB) may be attached to this FPC. The light-emitting device in the present example includes not only a light-emitting device body but also a state where an FPC or a PWB is attached thereto.

Next, the sectional structure will be explained with reference to FIG. 6(B). The driver circuits and the pixel portion are formed over a substrate 410. Here, the source side driver circuit 401 as the driver circuit portion and the pixel portion 402 are shown.

In the source side driver circuit 401, a CMOS circuit is formed of a combination of an n-channel TFT 423 and a p-channel TFT 424. The TFTs forming the driver circuit may be formed of a known CMOS circuit, PMOS circuit, or NMOS circuit. Although the present embodiment shows a driver integrated type in which a driver circuit is formed over a substrate, which is not always necessary, the driver circuit can be formed not over the substrate but outside the substrate.

The pixel portion 402 has a plurality of pixels, each including a switching TFT 411, a current controlling TFT 412, and a first electrode 413 electrically connected to a drain thereof. In addition, an insulator 414 is formed to cover an edge of the first electrode 413. Here, a positive photosensitive acrylic resin film is used to form the insulator 414.

Besides, in order to obtain a favorable coverage, the insulator 414 is made to have a top portion or bottom potion formed with a curved surface with a curvature. For example, in the case of using positive photosensitive acrylic as a material for the insulator 414, it is preferable that only a top portion of the insulator 414 has a curved surface with a curvature radius (0.2 μm to 3 μm). In addition, any of a negative photosensitive material that becomes insoluble in an etchant by light and a positive photosensitive material that becomes soluble in an etchant by light can be used as the insulator 414.

On the first electrode 413, a layer 416 including a luminescent material and a second electrode 417 are formed respectively. Here, as a material to be used for the first electrode 413 that functions as an anode, it is preferable to use a material that has a large work function. For example, in addition to single layers such as an ITO (indium tin oxide) film, an indium zinc oxide (IZO) film, a titanium nitride film, a chromium film, a tungsten film, a Zn film, and a Pt film, a laminate of titanium nitride and a film including aluminum as its main component, a three-layer structure of a titanium nitride film, a film including aluminum as its main component, and a titanium nitride film, and the like can be used. When a laminated structure is employed, the wiring has a lower resistance, favorable ohmic contact can be taken, and it is possible to function as an anode.

The layer 416 including the luminescent material is formed by evaporation that uses an evaporation mask or by inkjet. For a portion of the layer 416 including the luminescent material, a light-emitting organic compound according to the present invention is used. In addition, as materials that can be used for the layer 416 including the luminescent material, a low molecular weight material and a high molecular weight material may be used. Moreover, as a material to be used for the layer 416 including the luminescent material, it is often the case that an organic material is used for a single layer or laminate. However, the present invention includes a structure in which an inorganic compound is used for a part of a film including an organic compound.

In the case where it is desired to obtain a multicolor display image, a layer including an organic compound according to the present invention as a luminescent material may be formed separately depending on each different luminescent color by using a mask or a partition layer. In this case, a layer including a luminescent material for displaying each luminescent color may have a different laminated structure.

In addition, as a material to be used for the second electrode (cathode) 417 formed on the layer 416 including the luminescent material, a material that has a small work function (Al, Ag, Li, or Ca; an alloy thereof such as MgAg, MgIn, Al—Li, or $CaF_2$; or CaN) may be used. In the case of transmitting light generated in the layer 416 including the luminescent material through the second electrode 417, it is preferable to use a laminate of a metal thin film that has a thinned film thickness and a transparent conductive film (such as ITO (indium tin oxide), an alloy of indium oxide and zinc oxide ($In_2O_3$—ZnO), or zinc oxide (ZnO)) film as the second electrode (cathode) 417.

Further, the sealing substrate 404 and the element substrate 410 are bonded with the sealing material 405 to have a structure where a light-emitting element 418 is provided in the space 407 surrounded by the element substrate 410, the sealing substrate 404, and the sealing material 405. The space 407 also includes a structure of filling with the sealing material 405 in addition to a case of filling with an inert gas (such as nitrogen or argon).

It is preferable to use an epoxy resin for the sealing material 405. In addition, it is desirable to use a material that allows permeation of moisture or oxygen as little as possible. Further, as a material to be used for the sealing substrate 404, a plastic substrate including FRP (Fiberglass-Reinforced Plastics), PVF (polyvinylfluoride), Mylar, polyester, or acrylic can be used besides a glass substrate and a quarts substrate.

Also in the light-emitting device that has the light-emitting element according to the present invention as described above, the life can be extended.

EXAMPLE 5

Figure 7:
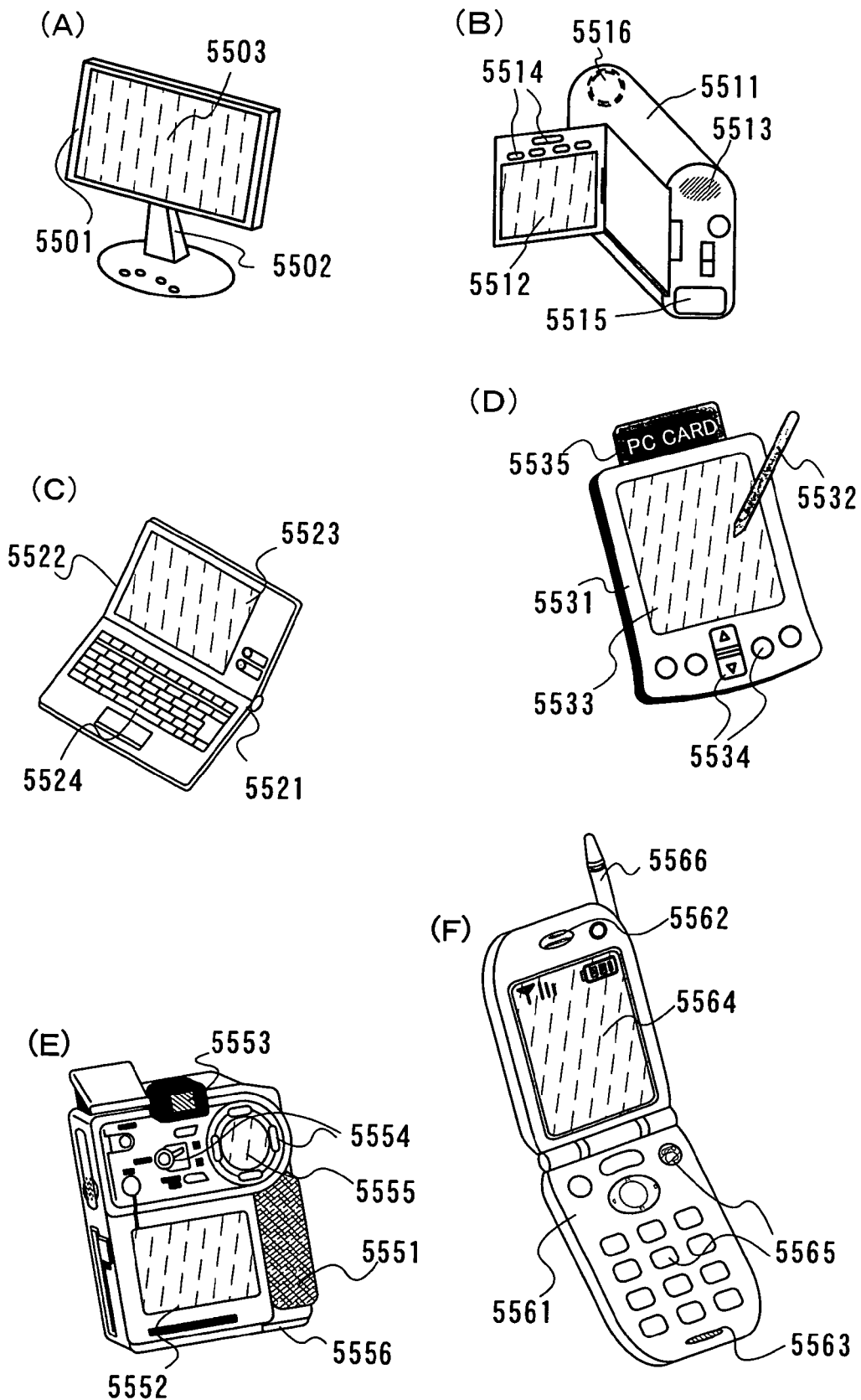
[FIG. 7]

In the present example, electronic devices to which the present invention is applied will be described with reference to FIG. 7. By applying the present invention, for example, in electronic devices as shown below, favorable display images can be obtained, where a defect due to the life of a light-emitting element is suppressed even when used for a long time.

FIG. 7(A) is a display device, which includes a frame body 5501, a support 5502, and a display portion 5503. A display device can be completed by incorporating the light-emitting device shown in Example 4 in the display device.

FIG. 7(B) is a video camera, which is composed of a main body 5511, a display portion 5512, a voice input 5513, operation switches 5514, a battery 5515, and an image receiving portion 5516. A display device can be completed by incorporating the light-emitting device shown in Example 4 in the video camera.

FIG. 7(C) is a laptop personal computer manufactured by applying the present invention, which is composed of a main body 5521, a frame body 5522, a display portion 5523, and a keyboard 5524. A display device can be completed by incorporating the light-emitting device shown in Example 4 in the laptop personal computer.

FIG. 7(D) is a personal digital assistance (PDA) manufactured by applying the present invention, which includes a main body 5531 provided with a display portion 5533, an external interface 5535, operation buttons 5534, and the like. As an attachment for operations, a stylus 5532 is provided. A display device can be completed by incorporating the light-emitting device shown in Example 4 in the personal digital assistance (PDA).

FIG. 7(E) is a digital camera, which is composed of a main body 5551, a display portion (A) 5552, an eye piece 5553, operation switches 5554, a display portion (B) 5555, and a battery 5556. A display device can be completed by incorporating the light-emitting device shown in Example 4 in the digital camera.

FIG. 7(F) is a cellular phone manufactured by applying the present invention, which includes a main body 5561 provided with a display portion 5564, a voice output portion 5562, a microphone 5563, operation switches 5565, an antenna 5566, and the like. A display device can be completed by incorporating the light-emitting device shown in Example 4 in the cellular phone.

As described above, a light-emitting device obtained by implementing the present invention may be used as display portions of all kinds of electronic devices.

The invention claimed is:

1. A light-emitting organic compound represented by a general formula (5):

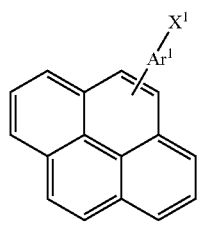

(5)

wherein $X^1$ represents a silyl group in which one or more aryl groups having 5 to 10 carbon atoms are bound to silicon, and wherein $Ar^1$ represents an unsubstituted or substituted aryl group having 5 to 10 carbon atoms.

2. A light-emitting element having the light-emitting organic compound according to claim 1.

3. The light-emitting element according to claim 2, wherein the light-emitting element has a layer including the light-emitting organic compound between a pair of electrodes.

4. The light-emitting element according to claim 2, wherein the light-emitting organic compound is used as a light emitter.

5. The light-emitting element according to claim 2, wherein the light-emitting organic compound is used as a host material.

6. The light-emitting organic compound according to claim 1, wherein $Ar^1$ is selected from the group consisting of a phenylene group and a naphthylene group.

7. The light-emitting organic compound according to claim 1, wherein $X^1$ is a triphenyl silyl group.

8. A light-emitting organic compound represented by a general formula (6):

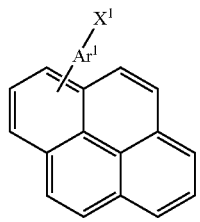

(6)

wherein $X^1$ represents a silyl group in which one or more aryl groups having 5 to 10 carbon atoms are bound to silicon, and wherein $Ar^1$ represents an unsubstituted or substituted aryl group having 5 to 10 carbon atoms.

9. A light-emitting element having, the light-emitting organic compound according to claim 8.

10. The light-emitting element according to claim 9, wherein the light-emitting element has a layer including the light-emitting organic compound between a pair of electrodes.

11. The light-emitting element according to claim 9, wherein the light-emitting organic compound is used as a light emitter.

12. The light-emitting element according to claim 9, wherein the light-emitting organic compound is used as a host material.

13. The light-emitting organic compound according to claim 8, wherein $Ar^1$ is selected from the group consisting of a phenylene group and a naphthylene group.

14. The light-emitting organic compound according to claim 8, wherein $X^1$ is a triphenyl silyl group.

15. A light-emitting organic compound represented by a general formula (7):

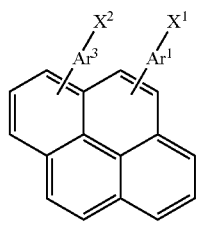

(7)

wherein $X^1$ and $X^2$, which are different from each other, individually represent a silyl group in which one or more aryl groups having 5 to 10 carbon atoms are bound to silicon, and wherein $Ar^1$ and $Ar^3$, which may be identical or different, individually represent an unsubstituted or substituted aryl group having 5 to 10 carbon atoms.

16. A light-emitting element having the light-emitting organic compound according to claim 15.

17. The light-emitting element according to claim 16, wherein the light-emitting element has a layer including the light-emitting organic compound between a pair of electrodes.

18. The light-emitting element according to claim 16, wherein the light-emitting organic compound is used as a light emitter.

19. The light-emitting element according to claim 16, wherein the light-emitting organic compound is used as a host material.

20. The light-emitting organic compound according to claim 15, wherein $Ar^1$ and $Ar^3$ are selected from the group consisting of a phenylene group and a naphthylene group.

21. The light-emitting organic compound according to claim 15, wherein one of $X^1$ and $X^2$ is a triphenyl silyl group.

22. A light-emitting organic compound represented by a general formula (8):

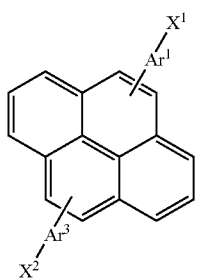

(8)

wherein $X^1$ and $X^2$, which are different from each other, individually represent a silyl group in which one or more aryl groups having 5 to 10 carbon atoms are bound to silicon, and wherein $Ar^1$ and $Ar^3$, which may be identical or different, individually represent an unsubstituted or substituted aryl group having 5 to 10 carbon atoms.

23. A light-emitting element having the light-emitting organic compound according to claim 22.

24. The light-emitting element according to claim 23, wherein the light-emitting element has a layer including the light-emitting organic compound between a pair of electrodes.

25. The light-emitting element according to claim 23, wherein the light-emitting organic compound is used as a light emitter.

26. The light-emitting element according to claim 23, wherein the light-emitting organic compound is used as a host material.

27. The light-emitting organic compound according to claim 22, wherein $Ar^1$ and $Ar^3$ are selected from the group consisting of a phenylene group and a naphthylene group.

28. The light-emitting organic compound according to claim 22, wherein one of $X^1$ and $X^2$ is a triphenyl silyl group.

29. A light-emitting organic compound represented by a general formula (9):

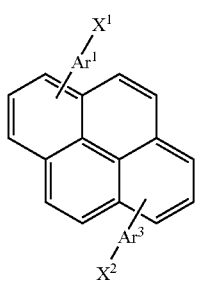

(9)

wherein $X^1$ and $X^2$, which are different from each other, individually represent a silyl group in which one or more aryl groups having 5 to 10 carbon atoms are bound to silicon, and wherein $Ar^1$ and $Ar^3$, which may be identical or different, individually represent an unsubstituted or substituted aryl group having 5 to 10 carbon atoms.

30. A light-emitting element having the light-emitting organic compound according to claim 29.

31. The light-emitting element according to claim 30, wherein the light-emitting element has a layer including the light-emitting organic compound between a pair of electrodes.

32. The light-emitting element according to claim 30, wherein the light-emitting organic compound is used as a light emitter.

33. The light-emitting element according to claim 30, wherein the light-emitting organic compound is used as a host material.

34. The light-emitting organic compound according to claim 29, wherein $Ar^1$ and $Ar^3$ are selected from the group consisting of a phenylene group and a naphthylene group.

35. The light-emitting organic compound according to claim 29, wherein one of $X^1$ and $X^2$ is a triphenyl silyl group.

36. A light-emitting organic compound represented by a general formula (10):

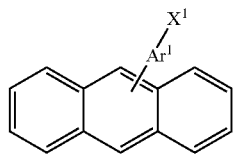

(10)

wherein $X^1$ is a triphenyl silyl group, and wherein $Ar^1$ represents an unsubstituted or substituted aryl group having 5 to 15 carbon atoms.

37. A light-emitting element having the light-emitting organic compound according to claim 36.

38. The light-emitting element according to claim 37, wherein the light-emitting element has a layer including the light-emitting organic compound between a pair of electrodes.

39. The light-emitting element according to, claim 37, wherein the light-emitting organic compound is used as a light emitter.

40. The light-emitting element according to claim 37, wherein the light-emitting organic compound is used as a host material.

41. The light-emitting organic compound according to claim 36, wherein $Ar^1$ is selected from the group consisting of a phenylene group and a naphthylene group.

42. A light-emitting organic compound represented by a general formula (11):

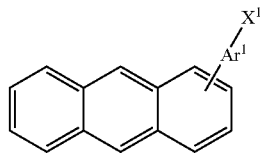

(11)

wherein $X^1$ represents a silyl group in which one or more aryl groups having 5 to 10 carbon atoms are bound to silicon, and wherein $Ar^1$ represents an unsubstituted or substituted aryl group having 5 to 15 carbon atoms.

43. A light-emitting element having the light-emitting organic compound according to claim 42.

44. The light-emitting element according to claim 43, wherein the light-emitting element has a layer including the light-emitting organic compound between a pair of electrodes.

45. The light-emitting element according to claim 43, wherein the light-emitting organic compound is used as a light emitter.

46. The light-emitting element according to claim 43, wherein the light-emitting organic compound is used as a host material.

47. The light-emitting organic compound according to claim 42, wherein $Ar^1$ is selected from the group consisting of a phenylene group and a naphthylene group.

48. The light-emitting organic compound according to claim 42, wherein $X^1$ is a triphenyl silyl group.

49. A light-emitting organic compound represented by a general formula (12):

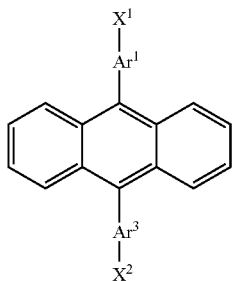

(12)

wherein $X^1$ and $X^2$, which are different from each other, individually represent a silyl group in which one or more aryl groups having 5 to 10 carbon atoms are bound to silicon, and wherein $Ar^1$ and $Ar^2$ individually represent an unsubstituted or substituted aryl group having 5 to 15 carbon atoms.

50. A light-emitting element having the light-emitting organic compound according to claim 49.

51. The light-emitting element according to claim 50, wherein the light-emitting element has a layer including the light-emitting organic compound between a pair of electrodes.

52. The light-emitting element according to claim 50, wherein the light-emitting organic compound is used as a light emitter.

53. The light-emitting element according to claim 50, wherein the light-emitting organic compound is used as a host material.

54. The light-emitting organic compound according to claim 49, wherein $Ar^1$ and $Ar^3$ are selected from the group consisting of a phenylene group and a naphthylene group.

55. The light-emitting organic compound according to claim 49, wherein one of $X^1$ and $X^2$ is a triphenyl silyl group.

56. A light-emitting organic compound represented by a general formula (13):

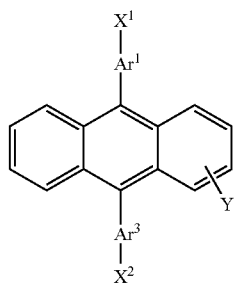

(13)

wherein $X^1$ and $X^2$, which are different from each other, individually represent a silyl group having one or more aryl groups having 5 to 10 carbon atoms, wherein $Ar^1$ and $Ar^3$ individually represent an unsubstituted or substituted aryl group having 5 to 15 carbon atoms, and wherein Y represents an alkyl group having 1 to 6 carbon atoms or an aryl group having 6 to 14 carbon atoms.

57. A light-emitting element having the light-emitting organic compound according to claim 56.

58. The light-emitting element according to claim 57, wherein the light-emitting element has a layer including the light-emitting organic compound between a pair of electrodes.

59. The light-emitting element according to claim 57, wherein the light-emitting organic compound is used as a light emitter.

60. The light-emitting element according to claim 57, wherein the light-emitting organic compound is used as a host material.

61. The light-emitting organic compound according to claim 56, Wherein $Ar^1$ and $Ar^3$ are selected from the group consisting of a phenylene group and a naphthylene group.

62. The light-emitting organic compound according to claim 56, wherein one of $X^1$ and $X^2$ is a triphenyl silyl group.

* * * * *